(12) United States Patent
Akinwande et al.

(10) Patent No.: US 10,832,885 B2
(45) Date of Patent: Nov. 10, 2020

(54) ELECTRON TRANSPARENT MEMBRANE FOR COLD CATHODE DEVICES

(71) Applicant: Massachusetts Institute of Technology, Cambridge, MA (US)

(72) Inventors: Akintunde I. Akinwande, Newton, MA (US); Stephen Angelo Guerrera, Waitsfield, VT (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/063,891

(22) PCT Filed: Dec. 23, 2016

(86) PCT No.: PCT/US2016/068532
§ 371 (c)(1),
(2) Date: Jun. 19, 2018

(87) PCT Pub. No.: WO2017/112937
PCT Pub. Date: Jun. 29, 2017

(65) Prior Publication Data
US 2018/0374669 A1 Dec. 27, 2018

Related U.S. Application Data

(60) Provisional application No. 62/387,503, filed on Dec. 23, 2015.

(51) Int. Cl.
*H01J 37/073* (2006.01)
*H01J 1/304* (2006.01)
(Continued)

(52) U.S. Cl.
CPC .......... *H01J 37/073* (2013.01); *H01J 1/304* (2013.01); *H01J 1/52* (2013.01); *H01J 29/62* (2013.01);
(Continued)

(58) Field of Classification Search
CPC .. H01J 37/00; H01J 37/02; H01J 37/06; H01J 37/065; H01J 37/073
(Continued)

(56) References Cited

U.S. PATENT DOCUMENTS 4,008,412 A    2/1977   Yuito et al.
5,126,633 A *   6/1992   Avnery ................... H01J 3/029
                                                            204/298.38
(Continued)

FOREIGN PATENT DOCUMENTS

KR   2015-0113635 A   10/2015
WO   WO 2014/179361 A1   11/2014

OTHER PUBLICATIONS

International Search Report and Written Opinion for Application No. PCT/US2014/014926 dated Nov. 18, 2014.
(Continued)

*Primary Examiner* — Jason L McCormack
(74) *Attorney, Agent, or Firm* — Wolf, Greenfield & Sacks, P.C.

(57) ABSTRACT

According to some aspects, a cold cathode device is provided, the device comprising a substrate, a field electron emitter disposed upon the substrate and configured to emit electrons in a first direction, and a structure encapsulating the field electron emitter, thereby creating an airtight seal around the field electron emitter, at least a portion of the structure being an atomically thin membrane positioned in the first direction with respect to the field electron emitter. According to some embodiments, at least one einzel lens may be located within the structure and configured to direct electrons emitted by the field electron emitter.

19 Claims, 6 Drawing Sheets

(51) Int. Cl.
*H01J 1/52* (2006.01)
*H01J 29/62* (2006.01)
*H01J 29/64* (2006.01)
*H01J 29/86* (2006.01)
*H01J 29/94* (2006.01)

(52) U.S. Cl.
CPC .............. *H01J 29/64* (2013.01); *H01J 29/86* (2013.01); *H01J 29/94* (2013.01)

(58) Field of Classification Search
USPC .......................................... 250/306, 307, 311
See application file for complete search history.

(56) References Cited

U.S. PATENT DOCUMENTS

| | | | |
|---|---|---|---|
| 5,199,917 | A | 4/1993 | MacDonald et al. |
| 5,266,530 | A | 11/1993 | Bagley et al. |
| 5,266,809 | A * | 11/1993 | Engel ...................... H01J 37/04 250/305 |
| 5,527,200 | A | 6/1996 | Lee et al. |
| 5,612,588 | A * | 3/1997 | Wakalopulos .......... B29C 71/04 313/420 |
| 5,627,427 | A | 5/1997 | Das et al. |
| 5,647,785 | A | 7/1997 | Jones et al. |
| 5,653,619 | A | 8/1997 | Cloud et al. |
| 5,688,707 | A | 11/1997 | Lee et al. |
| 5,857,885 | A | 1/1999 | Laou et al. |
| 5,892,231 | A | 4/1999 | Baylor et al. |
| 5,909,033 | A | 6/1999 | Koga et al. |
| 5,966,588 | A | 10/1999 | Ju et al. |
| 5,989,931 | A | 11/1999 | Ghodsian et al. |
| 6,069,018 | A | 5/2000 | Song et al. |
| 6,165,808 | A | 12/2000 | Zhang |
| 6,312,966 | B1 | 11/2001 | Tseng |
| 6,387,717 | B1 | 5/2002 | Blalock et al. |
| 6,394,109 | B1 * | 5/2002 | Somekh ................ B82Y 10/00 134/39 |
| 6,394,871 | B2 | 5/2002 | Lee |
| 6,417,016 | B1 | 7/2002 | Gilton et al. |
| 6,444,401 | B1 | 9/2002 | Lee |
| 6,448,701 | B1 | 9/2002 | Hsu |
| 6,936,817 | B2 * | 8/2005 | Feuerbaum .............. H01J 37/18 250/289 |
| 6,963,160 | B2 | 11/2005 | Schueller et al. |
| 7,259,051 | B2 | 8/2007 | Chen et al. |
| 7,326,328 | B2 | 2/2008 | Hudspeth et al. |
| 8,198,106 | B2 | 6/2012 | Akinwande et al. |
| 9,053,890 | B2 | 6/2015 | Sun et al. |
| 9,196,447 | B2 | 11/2015 | Fomani et al. |
| 9,748,071 | B2 | 8/2017 | Guerrera et al. |
| 2003/0038244 | A1 | 2/2003 | Clarence et al. |
| 2003/0178583 | A1 | 9/2003 | Kampherbeek et al. |
| 2004/0004588 | A1 | 1/2004 | Kawase et al. |
| 2004/0085012 | A1 | 5/2004 | Chen |
| 2004/0238809 | A1 | 12/2004 | Adamec et al. |
| 2005/0054208 | A1 | 3/2005 | Federov et al. |
| 2005/0092929 | A1 | 5/2005 | Schneiker |
| 2006/0043873 | A1 | 3/2006 | Hwang |
| 2006/0151774 | A1 | 7/2006 | Lee et al. |
| 2007/0114434 | A1 | 5/2007 | Chang et al. |
| 2007/0235772 | A1 | 10/2007 | Jin et al. |
| 2008/0235948 | A1 | 10/2008 | Bousse et al. |
| 2012/0156453 | A1 | 6/2012 | Gonzalez et al. |
| 2012/0224155 | A1 | 9/2012 | Kruit |
| 2013/0146221 | A1 * | 6/2013 | Kolmakov .......... B32B 38/0004 156/252 |
| 2013/0234025 | A1 * | 9/2013 | Monthioux ............ H01J 1/3044 250/311 |
| 2013/0293100 | A1 * | 11/2013 | Moody ..................... H01J 1/34 313/542 |
| 2014/0178584 | A1 * | 6/2014 | Zhuk ........................ B05D 1/60 427/255.6 |
| 2014/0285084 | A1 | 9/2014 | Fomani et al. |
| 2015/0206705 | A1 * | 7/2015 | Sakuma .................. H01J 37/20 250/453.11 |
| 2015/0294848 | A1 | 10/2015 | Green et al. |
| 2015/0371810 | A1 * | 12/2015 | Guerrera ............... H01J 37/065 250/396 R |
| 2016/0203944 | A1 * | 7/2016 | Ominami ................ H01J 37/16 250/310 |
| 2016/0254114 | A1 | 9/2016 | Fomani et al. |

OTHER PUBLICATIONS

International Preliminary Report and Patentability for Application No. PCT/US2014/014926 dated Aug. 11, 2015.
Invitation to Pay Additional Fees dated Jul. 14, 2017 in connection with International Application No. PCT/US2017/034287.
International Search Report and Written Opinion dated Sep. 18, 2017 in connection with International Application No. PCT/US2017/034287.
International Preliminary Report on Patentability dated Dec. 6, 2018 in connection with International Application No. PCT/US2017/034287.
International Search Report and Written Opinion for Application No. PCT/US2013/067559 dated Feb. 24, 2014.
International Preliminary Report and Patentability for Application No. PCT/US2013/067559 dated Jun. 18, 2015.
Invitation to Pay Additional Fees for Application No. PCT/US2016/068532 dated Mar. 8, 2017.
International Search Report and Written Opinion dated May 11, 2017 in connection with International Application No. PCT/US16/68532.
Baylor et al., Digital electrostatic electronic-beam array lithography. Journal of vacuum science & technology, American Vacuum Society. 2002; 20(6): 2646-50.
Bunch et al., Impermeable Atomic Membranes from Graphene Sheets. Nano Letters. 2008; 8(8): 2458-62.
Ding et al., Highly Uniform and Low Turn-On Voltage Si Field Emitter Arrays Fabricated Using Chemical Mechanical Polishing. IEEE Electron Device Letters. 2000; 21(2):66-9.
Ding et al., Silicon Field Emission Arrays With Atomically Sharp Tips: Turn-On Voltage and the Effect of Tip Radius Distribution. IEEE Transactions on Electron Devices. 2002; 49(12):2333-42.
Fomani et al., Toward Amp-Level Field Emission With Large-Area Arrays of Pt-Coated Self-Aligned Gated Nanoscale Tips. IEEE Transactions on Electron Devices. Jul. 2014;61(7):2538-46.
García, SLA 3-D Printed Arrays of Miniaturized, Internally Fed, Polymer Electrospray emitters. Journal of Microelectromechanical Systems. Dec. 2015; 24(6):2117-2127. entire document [retrieved on Sep. 4, 2017]. Retrieved from the Internet: http://ieeexplore.ieee.org/stamp/stamp.jsp?arnumber=7268787.
Guerrera et al., High Performance and Reliable Silicon Field Emission Arrays Enabled by Silicon Nanowire Current Limiters. IEEE Electron Devices Meeting (IEDM). Dec. 7-9, 2015. pp. IEDM15-851-IEDM15-854.
Guillorn et al., Fabrication of gated cathode structures using an in situ grown vertically aligned carbon nanofiber as a field emission element. J. Vac. Sci. Technol B. 2001;19(2):573-8.
Guillorn et al., Microfabricated field emission devices using carbon nanofibers as cathode elements. J. Vac. Sci. Technol. vol. B. 2001;19(6):2598-2601.
Guillorn et al., Operation of a gated field emitter using an individual carbon nanofiber cathode. Applied Physics Letters. 2001;79(21):3506-8.
Guillorn et al., Self-aligned gated field emission devices using single carbon nanofiber cathodes. Applied Physics Letters. 2002;81(19):3660-2.
Hong et al., Silicon metal-oxide-semiconductor field effect transistor/field emission array fabricated using chemical mechanical polishing. Journal of Vacuum Science & Technology B: Microelectronics and Nanometer Structures. 2003;21(1):500-5.
Pirio et al., Fabrication and electrical characteristics of carbon nanotube field emission microcathodes with an integrated gate electrode. Nanotechnology. 2002;(13):1-4.

(56) References Cited

OTHER PUBLICATIONS

International Preliminary Report on Patentability dated Jul. 5, 2018 in connection with International Application No. PCT/US2016/068532.

Bock et al., Electrospraying of polymers with therapeutic molecules: State of the art. Progress in Polymer Science 2012;37(11):1510-1551.

Bock et al., Electrospraying, a Reproducible Method for Production of Polymeric Microspheres for Biomedical Applications. Polymers. 2011;3(1):131-149.

Chen et al., Spraying modes in coaxial jet electrospray with outer driving liquid. Physics of Fluids. Mar. 2005;17(3):032101-7.

Gassend et al., Precision in-plane hand assembly of bulk-microfabricated components for high-voltage MEMS arrays applications. J. Microelectromech. Systems. Apr. 2009;18(2):332-346.

Kim et al., Microspheres for Drug Delivery. In:Ferrari M, Lee AP,Lee LJ (eds). BioMEMS and Biomedical Nanotechnology: vol. I Biological and Biomedical Nanotechnology. Springer US: Boston, MA, 2006; pp. 19-50.

Koo et al., Microencapsulation of peppermint oil in an alginate-pectin matrix using a coaxial electrospray system. International Journal of Food Science & Technology. 2014;49(3):733-739.

Krpoun et al., Tailoring the hydraulic impedance of out-of-plane micromachined electrospray sources with integrated electrodes. Applied Physics Letters. Apr. 2009; 94(16):163502.

Kumar et al., Recent Advancement in Functional CoreShell Nanoparticles of Polymers: Synthesis, Physical Properties, and Applications in Medical Biotechnology. Journal of Nanoparticles. 2013;2013:672059;24 pages.

López-Herrera et al., Coaxial jets generated from electrified Taylor cones. Scaling laws. Journal of Aerosol Science. 2003;34(5):535-552.

Loscertales et al., Micro/Nano Encapsulation via Electrified Coaxial Liquid Jets. Science. Mar. 1, 2002;295(5560):1695-1698.

Marín et al., Simple and double emulsions via coaxial jet electrosprays. Physical Review Letters. Jan. 5, 2007;98(1):014502; 4 pages.

Mei et al., Operational modes of dual-capillary electrospraying and the formation of the stable compound cone-jet mod. Aerosol and Air Quality Research. Jun. 2008;8(2):218-232.

Nangrejo et al., Ceramic encapsulation with polymer via co-axial electrohydrodynamic jetting. Journal of Microencapsulation. 2010;27(6):542-551.

Olvera-Trejo et al., 3-D Printed Microfluidic Devices for Electrohydrodynamic Generation of Core-Shell Microparticles. Solid-State Sensors, Actuators and Microsystems Workshop. Hilton Head Island, South Carolina. Jun. 5-9, 2016;176-9.

Olvera-Trejo et al., Additively manufactured MEMS multiplexed coaxial electrospray sources for high-throughput, uniform generation of core-shell microparticles. Lab on a Chip. 2016; 16:4121-4132.

Pang et al., Densities and viscosities of aqueous solutions of 1-propanol and 2-propanol at temperatures from 293.15 K to 333.15 K. Journal of Molecular Liquids. 2007;136(1-2):71-78.

Prewett et al., Focused Ion Beams from Liquid Metal Ion Sources. Wiley. 1991.

Sinha-Ray et al., Encapsulation of self-healing materials by coelectrospinning, emulsion electrospinning, solution blowing and intercalation. Journal of Materials Chemistry. 2012; 22(18):9138-9146.

Taylor, Disintegration of Water Drops in an Electric Field. Proceedings of the Royal Society of London A: Mathematical, Physical and Engineering Sciences. 1964;280(1382):383-397.

Vazquez et al., Surface Tension of Alcohol + Water from 20 to 50° C. Journal of Chemical & Engineering Data. 1995;40(3):611-614.

Velásquez-García et al., A MicroFabricated Linear Array of Electrospray Emitters for Thruster Applications. Journal of Microelectromechanical Systems. Oct. 2006;15(5):1260-1271.

Velásquez-García, SLA 3-D printed arrays of miniaturized, internally fed, polymer electrospray emitters. J. Microelectromech. Systems. Dec. 2015;24(6):2117-2127.

Wong et al., A Review of Additive Manufacturing. ISRN Mechanical Engineering. 2012;208760:10 pages.

Xi et al., Hollow hemispherical titanium dioxide aggregates fabricated by coaxial electrospray for dye-sensitized solar cell application. Journal of Nanophotonics. 2012;6(1):063519-063511.

Xie et al., Electrohydrodynamic atomization: A two-decade effort to produce and process micro-/nanoparticulate materials. Chemical Engineering Science. 2015;125:32-57.

Xie et al., Encapsulation of protein drugs in biodegradable microparticles by co-axial electrospray. Journal of Colloid and Interface Science. 2008;317(2):469-476.

Xu et al., Coaxial electrohydrodynamic atomization process for production of polymeric composite microspheres. Chemical Engineering Science. Dec. 18, 2013: 104; 330-346.

Yang et al., Core-Shell Microcapsules With Embedded Microactuators for Regulated Release. Journal of Microelectromechanical Systems. Jun. 2013;22(3):509-518.

Zeleny, The electrical discharge from liquid points, and a hydrostatic method of measuring the electric intensity at their surfaces. The Physical Review. Feb. 1914;III (2):69-91.

Zhang et al., Coaxial electrospray of microparticles and nanoparticles for biomedical applications. Expert Review of Medical Devices. Nov. 2012;9(6):595-612.

\* cited by examiner

ELECTRON TRANSPARENT MEMBRANE FOR COLD CATHODE DEVICES

CROSS-REFERENCE TO RELATED APPLICATIONS

This application is a national stage application under 35 U.S.C. § 371 of International Patent Application Serial No. PCT/US2016/068532, filed on Dec. 23, 2016, entitled "ELECTRON TRANSPARENT MEMBRANE FOR COLD CATHODE DEVICES," which claims priority to U.S. Provisional Patent Application No. 62/387,503, filed on Dec. 23, 2015, titled "Electron Transparent Anode/Window Field Emitter Array," each of which is hereby incorporated by reference in its entirety.

GOVERNMENT LICENSE RIGHTS

This invention was made with Government support under Grant No. N66001-12-1-4212 awarded by the Space and Naval Warfare Systems Center. The Government has certain rights in the invention.

BACKGROUND

There are, broadly speaking, two ways to liberate an electron from a metal or a semiconductor. First, energy can be imparted to the electron (e.g., thermally, by supplying electromagnetic radiation, etc.) that is sufficient to overcome the potential barrier that represents forces against the electron's liberation. Alternatively, the potential barrier can be deformed by the application of an electric field to a point where electrons can quantum tunnel through the barrier. This latter phenomenon is termed "field emission."

Cold cathode devices are devices that emit electrons whilst relying on methods other than thermionic emission. That is, the electrons overcome the potential barrier by means other than thermal energy and/or the electrons tunnel through the potential barrier. For instance, some fluorescent lamps liberate electrons into a gas-filled tube by applying a large electric potential difference between opposing electrodes of the tube. The electrostatic potential allows tunneling of electrons out of the cathode and into the gas. While such electrodes may not actually be "cold" in practice, the device is considered a cold cathode device because the electrons are not produced by raising the temperature of the electrode above the temperature at which the material will thermally emit electrons.

Field emitter arrays (FEAs) are a class of cold cathode devices that produce electrons using multiple emitters that each produce electrons via field emission. FEAs have the potential to produce a high current density, but must be operated in high vacuum environments since otherwise adsorption and/or desorption of gas molecules by the emitters would significantly degrade their performance.

SUMMARY

According to some aspects, a cold cathode device is provided, the device comprising a substrate, a field electron emitter disposed upon the substrate and configured to emit electrons in a first direction, and a structure encapsulating the field electron emitter, thereby creating an airtight seal around the field electron emitter, at least a portion of the structure being an atomically thin membrane positioned in the first direction with respect to the field electron emitter.

According to some embodiments, the structure encapsulates a plurality of field electron emitters.

According to some embodiments, the field electron emitter is a semiconductor or metal field emitter.

According to some embodiments, the plurality of field electron emitters comprise an array of self-aligned gate field emitters.

According to some embodiments, ambient pressure inside the structure is less than 1 Torr.

According to some embodiments, the field electron emitter is a silicon field emitter.

According to some embodiments, the silicon field emitter comprises a silicon nanowire current limiter.

According to some embodiments, the field electron emitter comprises a tapered tip.

According to some embodiments, the tip of the field electron emitter has a coating comprising a semiconductor or metallic material.

According to some embodiments, the tip of the field electron emitter has a coating comprising at least one noble metal.

According to some embodiments, the atomically thin membrane comprises a 2-dimensional material.

According to some embodiments, the atomically thin membrane comprises graphene.

According to some embodiments, the atomically thin membrane comprises a single layer of graphene.

According to some embodiments, the atomically thin membrane comprises silicon nitride and/or amorphous silicon.

According to some embodiments, the cold cathode device is configured to operate the field electron emitter as a cathode and the atomically thin membrane as an anode.

According to some embodiments, the cold cathode further comprises at least one getter located within the structure.

According to some aspects, an electron microscope is provided comprising the cold cathode.

According to some aspects, an excimer laser is provided comprising the cold cathode.

According to some aspects, a cold cathode device is provided, the device comprising a substrate, a field electron emitter disposed upon the substrate and configured to emit electrons in a first direction, a structure encapsulating the field electron emitter, thereby creating an airtight seal around the field electron emitter, at least a portion of the structure being an atomically thin membrane positioned in the first direction with respect to the field electron emitter, and at least one electrostatic or magnetic lens located within the structure and configured to direct electrons emitted by the field electron emitter.

According to some embodiments, the cold cathode further comprises at least one positively charged electrode located within the structure.

According to some embodiments, the at least one electrostatic or magnetic lens comprises at least one einzel lens.

According to some embodiments, the structure encapsulates a plurality of field electron emitters.

According to some embodiments, ambient pressure inside the structure is less than 1 Torr.

According to some embodiments, the field electron emitter is a silicon field emitter.

According to some embodiments, the atomically thin membrane comprises graphene.

According to some embodiments, the einzel lens has an annular shape.

The foregoing embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
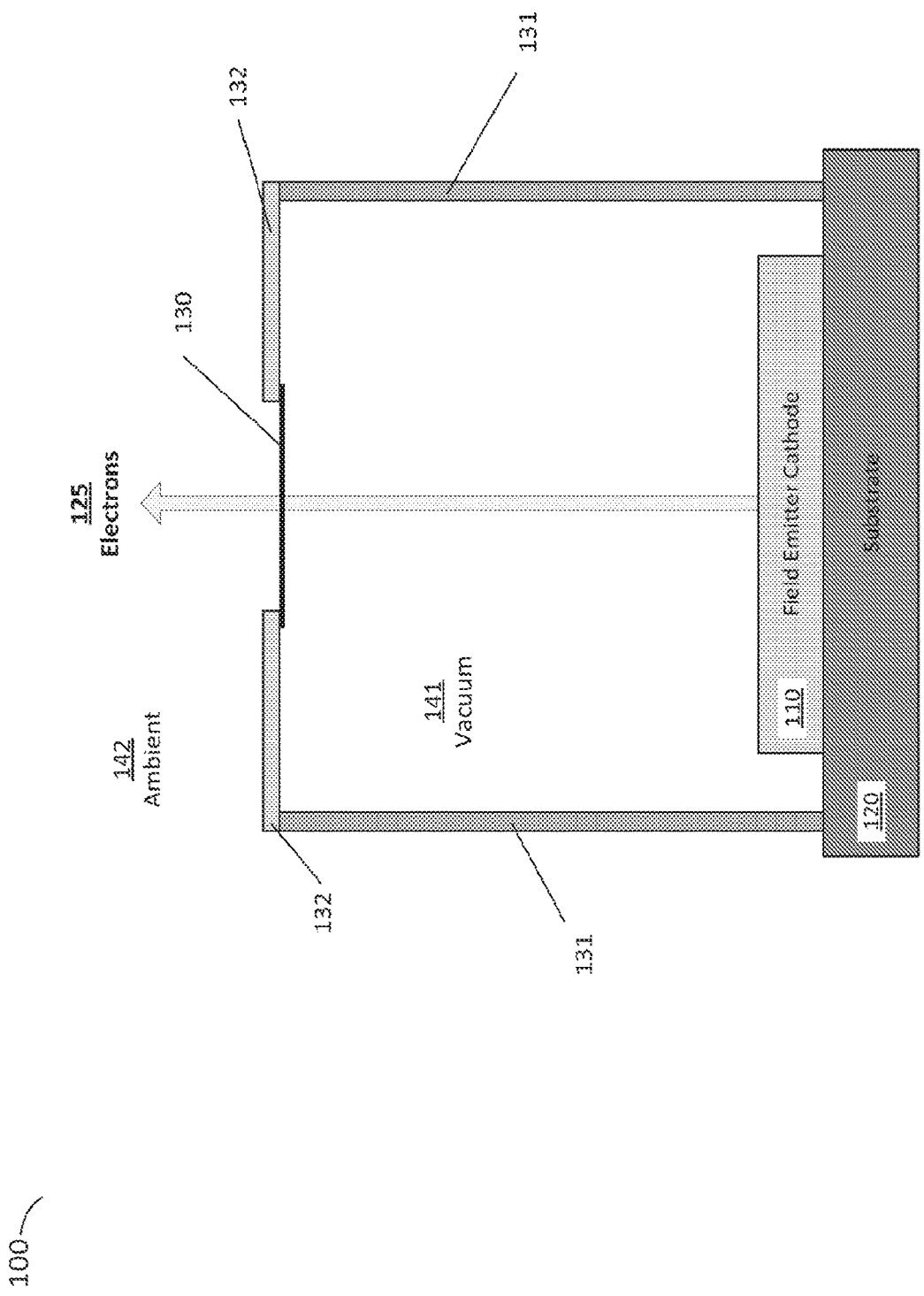
FIG. 1 depicts an illustrative field emitter cathode encapsulated by a structure including an electron transparent membrane, according to some embodiments.

While cold cathodes based on field emitter arrays have great potential as a high current density electron source, they have not demonstrated long lifetimes nor the ability to work in a poor vacuum environment. Since the emission current of a field emitter depends upon the height of the potential barrier between a material and the vacuum, a reliable field emitter device would have a well-defined potential barrier height that remains relatively static over time. However, a number of effects can prevent this type of performance. Gas molecules present near the field emitter can be adsorbed onto the surface, which induces changes in the height of the potential barrier of the emitter. In addition, gas molecules may produce ions (which may, for example, form a plasma) that interact with the emitter and erode or otherwise damage it. These effects may reduce the current density and/or the lifetime of the field emitter device.

The conventional approach to mitigate these effects is to deploy field emitter arrays only in low pressure environments (e.g., in vacuum), which minimizes or avoids the effects that gas molecules can have upon the emitter. This, however, severely limits the types of environments in which the field emitter can be used. In view of these challenges, a field emitter device must either be deployed in a vacuum or near-vacuum device, or deployed in a non-vacuum environment and suffer unreliability and/or reduced lifetime due to the effects of nearby gases.

The inventors have recognized and appreciated techniques for encapsulating a field emitter using a membrane that is permeable to emitted electrons yet impermeable to other ions or molecules. This membrane enables use of a low pressure environment in the immediate vicinity of the field emitter, yet does not limit the types of environments in which the encapsulated emitter can be used, because any gas molecules outside of the encapsulated region are unable to reach the emitter and thereby produce the above described negative effects upon the emitter. Due to the properties of the membrane, electrons produced by the emitter can still escape from the device. Thus, a device utilizing such a membrane may be deployed in a wide range of ambient environments whilst heightening lifetime and producing high current. Moreover, the encapsulation of the field emitter admits a modular design approach, since an encapsulated field emitter (or array of field emitters) can be produced and installed as a unit in any suitable device.

According to some embodiments, a membrane encapsulating a field electron emitter may be atomically thin. An atomically thin membrane can, for example, be a layer of graphene, which is a one atom thick allotrope of carbon. An atomically thin membrane may include multiple atomically thin layers (e.g., 2, 5, 10 layers, etc.), while nonetheless having a thickness comparable to that of an atomically thin layer. For example, an atomically thin membrane may have a thickness between 0.1 nm and 10 nm, or between 0.3 nm and 5 nm, or between 0.345 nm and 2 nm. The theoretical thickness of a sheet of graphene is 0.345 nm, and so an atomically thin membrane comprising a single layer of graphene would be expected to have a thickness of approximately 0.345 nm. Where an atomically thin membrane comprises multiple atomically thin layers, layers may be stacked on one another and/or layers may be bonded to adjacent layers. In some cases, when multiple atomically thin layers are grown, they may be bonded to one another as a result of the formation process. In some embodiments, an atomically thin membrane may comprise a thin film of a material such as silicon nitride and/or amorphous silicon.

As referred to herein, a membrane that is "permeable" to electrons or "transparent" to electrons indicates that electrons having a kinetic energy above some threshold energy will penetrate the membrane from one side and emerge from the opposing side. In some cases, the electrons may lose energy due to collisions within the membrane, although this energy loss may be de minimis.

According to some embodiments, an encapsulated field emitter may be a silicon field emitter. The inventors have recognized and appreciated a design for a silicon field emitter that produces high current density with long lifetimes at low operating voltages. In some embodiments, the silicon field emitter includes a silicon nanowire current limiter in series with an emission tip of the emitter structure. The current limiters may mitigate emitter tip failure due to Joule heating, thereby producing a field emitter with a higher reliability.

Following below are more detailed descriptions of various concepts related to, and embodiments of, techniques for encapsulating a field emitter using a membrane that is permeable to emitted electrons. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 depicts an illustrative field emitter cathode encapsulated by a structure including an electron transparent membrane, according to some embodiments. Device 100 illustrates one suitable geometrical arrangement of a field emitter cathode and electron transparent membrane, although other such arrangements could be envisioned. In device 100, a field emitter cathode 110 is mounted on a substrate 120 (e.g., a silicon substrate) and encapsulated within a structure described below.

In general, the encapsulating structure of an encapsulated field emitter cathode may have any suitable shape and the rectangular cross-sectional shape shown in the example of FIG. 1 is merely provided as an illustrative example. The important feature of the shape of the encapsulating structure is that the membrane 130 is positioned such that electrons 125 emitted by the field emitter cathode 110 are directed through the membrane.

In the example of FIG. 1, the membrane forms part of the structure that encapsulates the field emitter cathode, where the structure also comprises standoffs 131 and supports 132. In some embodiments, the membrane 130 may span the entire width of the upper surface of the structure, thereby contacting standoffs 131, such that the supports 132 are no longer included. The example of FIG. 1, however, includes these supports as an illustrative embodiment.

As described above, the encapsulated field emitter cathode 110 is enclosed such that gas from the ambient environment 142 cannot substantially enter the enclosed space. In the example of FIG. 1, the interior space of the encapsulated structure is under vacuum 141. For example, the pressure of vacuum 141 may be less than 1 Torr, less than 1 mTorr, between $10^{-6}$ Torr and $10^{-3}$ Torr, or between $10^{-5}$ Torr and $10^{-2}$ Torr. As described above, a very low pressure environment in the vicinity of a field emitter may reduce changes in the height of the potential barrier of the emitter and/or damage to the emitter caused by gas molecules. The ambient environment 142 may exhibit any ambient pressure, although in general may exhibit a higher pressure than the environment 141 so that the particular benefits of the membrane 130 are utilized (namely, the ability of the membrane to allow electrons to exit the encapsulated structure whilst being impermeable to gases originating outside the structure).

Field Emitter Cathode 110 may include any one or more sources that emit electrons via field emission. In some embodiments, the field emitter cathode 110 includes a field emitter array (FEA), being a collection of individual, small field electron emitters arranged to produce electrons as an ensemble. In some implementations, such emitters may be arranged in a regular two-dimensional pattern. An illustrative example of a field electron emitter suitable for use in an FEA is discussed below.

Membrane 130 may be formed from one or more materials such that the membrane is mechanically able to tolerate the difference in pressure between the interior and exterior of the encapsulated structure. In some embodiments, this difference in pressure may be $10^4$ Torr or greater, or $10^6$ Torr or greater. Since the membrane is also very thin, ideal materials from which the membrane may be formed include those with a high elastic modulus (e.g., greater than 100 GPa) and/or a high tensile strength (e.g., greater than 50 GPa), and materials that are thermally and/or chemically stable. The membrane 130 may be formed from any suitable conductor or semiconductor material, such as but not limited to, graphene, SiN, BN, transition metal dichalcogenide, amorphous silicon, or combinations thereof.

In some embodiments, the membrane 130 may have a thickness that is between 10 nm and 10 µm, or between 100 nm and 1 µm, or between 1 nm and 10 nm, or between 0.5 nm and 5 nm. As discussed above, a membrane may be an atomically thin membrane having a thickness comparable to that of a single layer of atoms. A suitably thin membrane, such as an atomically thin membrane, may allow for transmission of electrons with kinetic energy less than around 50-100 eV. In contrast, some conventional membranes that are several microns thick may require electrons to have a much higher kinetic energy of at least 10-100 keV for adequate transmission through the membrane.

According to some embodiments, the membrane 130 may be formed from a 2-dimensional material. A 2-dimensional material, sometimes referred to as a 2D topological material or a single layer material, is a crystalline material formed from a single layer of atoms. For example and without limitation, the membrane 130 may be formed from a single layer of graphene, graphyne, borophene, molybdenite, germanene or phosphorene.

According to some embodiments, the membrane 130 may be formed from a single layer, or multiple layers, of graphene. The thickness of a single layer of graphene (around 0.5 nm) and low atomic number of carbon (Z=6) produces a membrane with a very small electron scattering cross section, even for low energy electrons (e.g., <100 eV). Moreover, even a single atomic layer of graphene is impermeable to gas molecules, even those as small as helium. Graphene also has a high tensile strength of around 130 GPa, thereby allowing for a large pressure differential between the interior and exterior of the encapsulated structure.

According to some embodiments, a graphene membrane may be incorporated within device 100 shown in FIG. 1 via the following method. Graphene may be synthesized by hot-walled thermal chemical vapor deposition (CVD) onto a catalyst material (e.g., copper). Subsequently, poly(methyl methacrylate) (PMMA) may be spun onto the graphene. The catalyst may be etched and the graphene applied onto a portion of the device structure (e.g., applied to the edges of the supports 132 in the example of FIG. 1). The PMMA may then be dissolved in acetone, leaving the graphene layer in intimate contact with the portion of the device.

According to some embodiments, the membrane 130 may be configured to operate as an anode. That is, the membrane may be electrically coupled to a source of electrical potential. The potential difference between the membrane 130 and the field emitter cathode 110 may be between 5 V and 100 V, or between 1 V and 10 V. In devices in which the distance between the field emitter cathode 110 and the membrane 130 is small (e.g., less than 10 µm), even a small potential difference between the membrane and the field emitter cathode can produce a large electric field within the structure (e.g., greater than $10^6$ V/m). According to some embodiments, the distance between the field emitter cathode 110 and the membrane 130 may be between 10 nm and 10 µm, or between 100 nm and 5 µm, or between 0.5 µm and 5 µm.

According to some embodiments, the device 100 may include one or more getters within the encapsulated structure that assist with obtaining and/or maintaining the vacuum 141.

Figure 2:
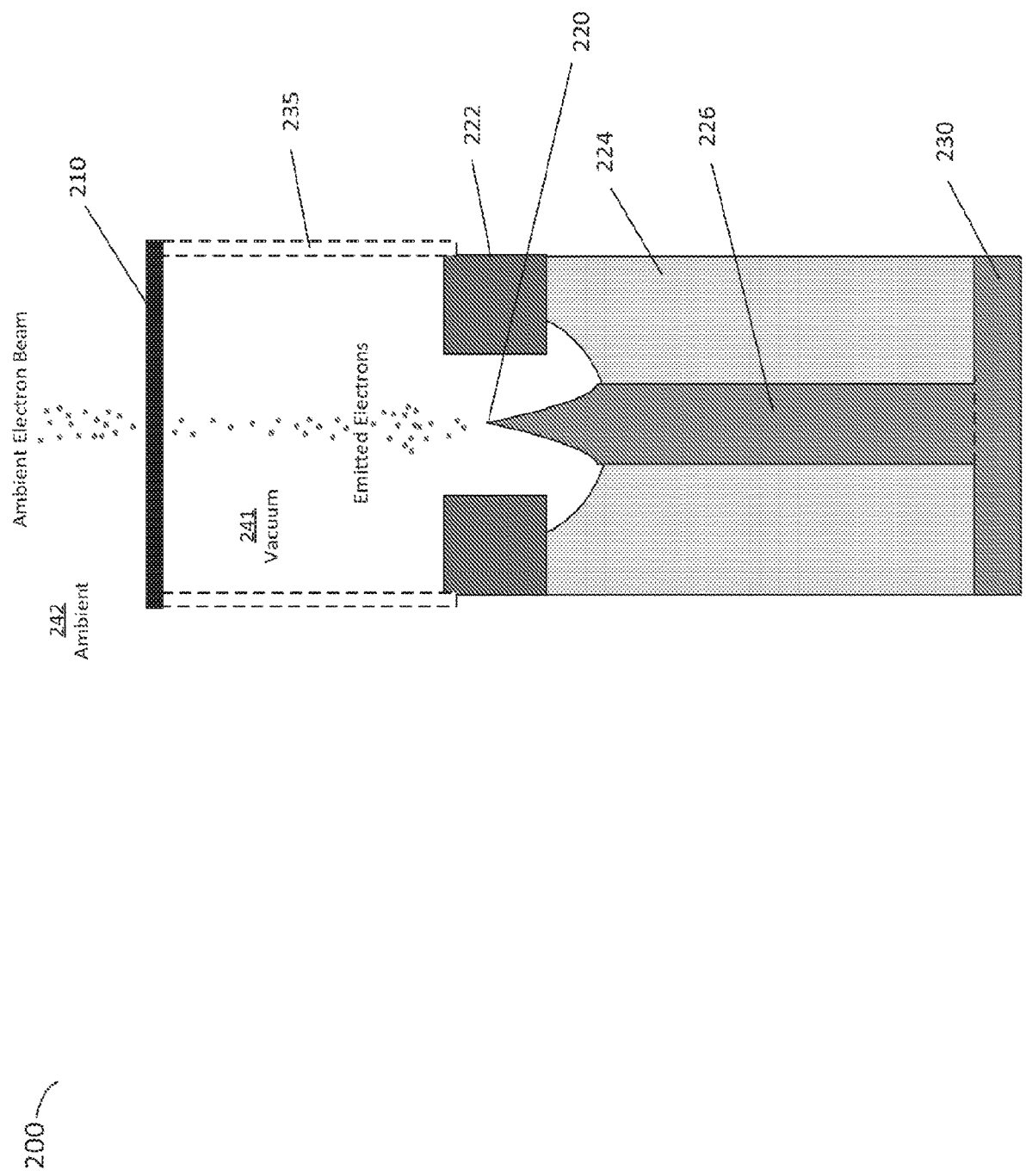
FIG. 2 depicts an illustrative silicon field emitter device, according to some embodiments.

FIG. 2 depicts an illustrative silicon field emitter device, according to some embodiments. Device 200 is an example of device 100 in which the field emitter cathode 110 is a silicon field emitter having a particular design to be described below. Membrane 210 may be an atomically thin layer and may have any of the properties described above in relation to membrane 130. In the example of FIG. 2, any number of silicon field emitters represented by the combination of elements 220, 222, 224, 226 and 230 may be included within one encapsulated structure. As such, standoffs 235 are shown in dashed lines as optional elements to be adjacent to the particular silicon field emitter shown in the figure. It will be appreciated that standoffs may be provided to encapsulate whatever number of silicon field emitters are selected for encapsulation, and that a given silicon field emitter may be adjacent to a standoff on either side or standoffs on both sides. A vacuum environment 241 is present within the encapsulated structure, with the ambient environment 242 being outside of the structure.

Generally speaking, the performance of field emitter cathodes can be limited due to the lack of understanding of the impact of material properties and/or processes on the electron emission process. While cold cathodes produced from field emitter arrays (FEAs) can operate at room temperature, they may not, in some cases, produce the desired current density (e.g., >20 A/cm$^2$) for vacuum electronic devices and/or may not exhibit the desired lifetimes (e.g., >10,000 hours).

Four challenges to produce field emission devices with high performance and long lifetime are: (1) breakdown of the insulator between the emitter substrate and the extraction gate due to charge injection into the insulator; (2) emitter tip burnout due to Joule heating, thermal runaway, and/or cathodic arcs; (3) emitter tip erosion due to bombardment by back-streaming ions generated from gas molecules desorbed from the anode, gate or other surfaces in the device; and (4) the large capacitance between the gate and the substrate which leads to large stored energy and hence potential for failure and limited high frequency performance. As discussed above, challenge (3) is addressed by the thin membrane as described herein, which allows electrons to be output from an emitter under vacuum without the entire device needing to itself be within the vacuum. The illustrative silicon emitter design shown in FIG. 2 is one approach to address the other three challenges described above.

Field emission can be thought of as a multi-step transport process. Electrons are first transported through a material to some surface barrier. When the electrons reach the barrier, there is a non-zero probability that the electrons impinging on the barrier will be transmitted instead of reflected. Finally, electrons that are transmitted are accelerated to an anode. In the example of FIG. 2, electrons within silicon current limiter 226 and/or substrate 230 are transported to the a silicon field emitter tip 220. Electrons reaching the potential barrier represented by the tip apex of the silicon field emitter may be transmitted into the vacuum and accelerated by the anode membrane 210.

A gate electrode 222 produces an electric field that alters the potential barrier experienced by electrons at the silicon field emitter tip 220, allowing quantum tunneling of electrons out of the material and into the vacuum. In some embodiments, the gate electrode has an annular shape centered around the emitter tip 220. While an electric field strength needed to produce current from the field emitter tip 220 is generally very high (e.g., >100 MV/m), if the distance between the tip and the gate electrode 222 is small (e.g., <150 nm), a sufficient electric field can be produced with low gate electrode (gate-to-emitter) voltages (e.g., 10V).

One challenge with fabrication at small scales of gate electrodes and field emitter tips as shown in the example of FIG. 2, is to form the gate as close as possible to the emitter tip without producing an electrical short between the two. To prevent a short between the gate electrode 222 and the silicon current limiter 226 or substrate 230, a dielectric 224 is provided. Moreover, if the aperture of the gate electrode 222 is not sufficiently aligned with the field emitter tip 220 in the center of the aperture, the electric field around the tip will be asymmetric, causing emitted electrons to experience an unwanted transverse force and possibly directing those electrons into the standoffs 235 and/or gate 222.

In the example of FIG. 2, the silicon field emitter is formed from a current limiter 226 and emitter tip 220. The current produced by field emitters is generally controlled by the probability of electrons tunneling through the potential barrier represented by the tip apex of the silicon field emitter into the vacuum. The tunneling probability is very sensitive to the radius of the field emitter tip and the work function of the emitter. The introduction of a current limitation element, as in the example of FIG. 2, changes the system to make the transport process the dominant process in controlling the current and to reduce the sensitivity of the current to tip radius and work function.

According to some embodiments, the current limiter 226 may be formed from a silicon nanowire. Such a current limiter may, for example, mitigate emitter tip failure or other damage due to Joule heating, thereby producing a more reliable emitter. In some embodiments, the nanowire may have a diameter between 10 nm and 1 μm, or between 100 nm and 500 nm, or between 50 nm and 300 nm, such as 100 nm. In some embodiments, the nanowire may have a height (the long axis shown in FIG. 2 running vertically on the page) between 1 μm and 100 μm, or between 5 μm and 50 μm, or between 1 μm and 20 μm, or between 5 μm and 15 μm, such as 10 μm. In some embodiments, the aspect ratio of the silicon nanowire (the ratio of the height to the diameter) may be between 20 and 200, or between 50 and 150, or between 80 and 120, or around 100.

According to some embodiments, the gate conductor 222 may be formed from polysilicon. In some implementations, the polysilicon may be doped. According to some embodiments, the dielectric 224 may be silicon dioxide.

According to some embodiments, the silicon emitter tip 220 may be coated with one or more refractory and/or noble metals, such as, but not limited to, tantalum, tungsten, niobium, molybdenum, ruthenium, rhodium, palladium, silver, osmium, gold, platinum and/or iridium. These materials may aid in preventing damage to the tip due to Joule heating caused by the flow of electrons through the tip.

In some embodiments, current limiters amongst a plurality of field emitters (e.g., if the silicon field emitter of FIG. 2 is one emitter in a field emitter array) may be electrically coupled together in series. Coupling in series may limit the current produced by each field emitter in the array, which may produce more uniform emissions from the emitters without also causing thermal runaway and/or burnout.

In some embodiments, where the silicon field emitter of FIG. 2 is one emitter in a field emitter array: spacing between emitter tips of the array may be between 100 nm and 10 μm, or between 500 nm and 5 μm, or between 750 nm and 2 μm, such as approximately 1 μm; and tip density may be between $10^6$ tips/cm and $10^9$ tips/cm, or between $10^7$ tips/cm and $10^9$ tips/cm, such as around $10^8$ tips/cm.

According to some embodiments, the diameter of the aperture in the gate 222 may be between 100 nm and 500 nm, or between 200 nm and 400 nm, or between 300 nm and 400 nm, such as approximately 350 nm. According to some embodiments, the distance between the emitter tip 220 and the anode membrane 210 may be between 10 nm and 10 cm, or between 100 nm and 100 μm, or between 1 μm and 20 μm, or between 100 nm and 5 μm, or between 500 nm and 2 μm, or approximately 1 μm.

Figure 3:
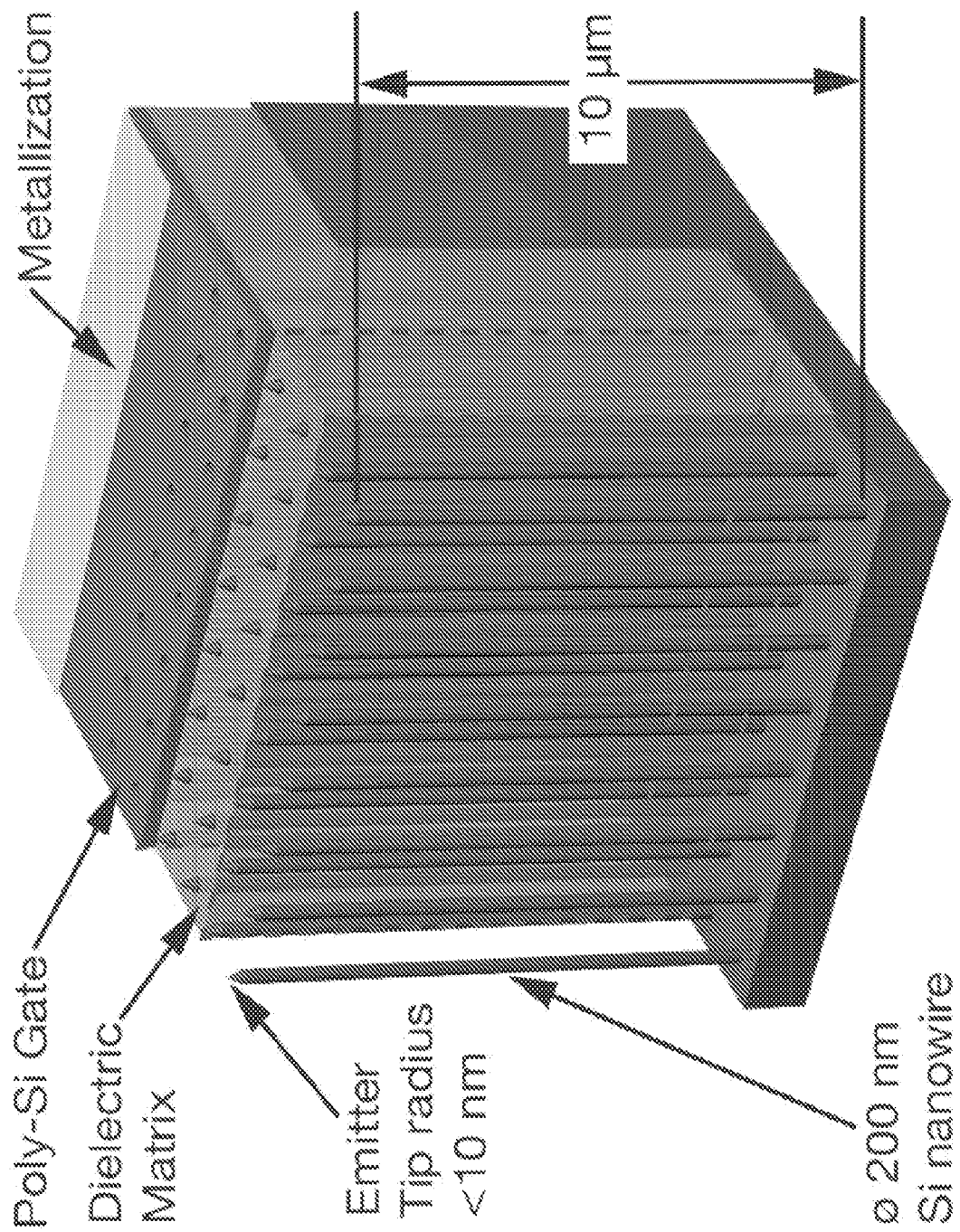
FIG. 3 is a three-dimensional drawing of a device including a plurality of silicon field emitter devices, according to some embodiments.

FIG. 3 is a three-dimensional drawing of a device including a plurality of silicon field emitter devices, according to some embodiments. FIG. 3 is an example of a field emitter array utilizing a plurality of silicon field emitters as shown in FIG. 2, although the standoffs and electron transparent membrane are not shown in FIG. 3 for clarity. Nonetheless, it will be appreciated that the array shown in FIG. 3 may be encapsulated using, in part, an electron transparent membrane through which electrons emitted by the field emitters may pass.

In the example of FIG. 3, portions of the device are shown in cutaway so as to illustrate each portion in the figure. The dielectric matrix fills spaces between the silicon nanowires with the exception of the emitter tips. The emitter tips are exposed within circular apertures within the polysilicon gate material, with the emitter tips being centered within the apertures. According to some embodiments, the fabrication process that produced the device of FIG. 3 may comprise self-alignment of the emitter tips within the gate apertures.

Figure 4B:
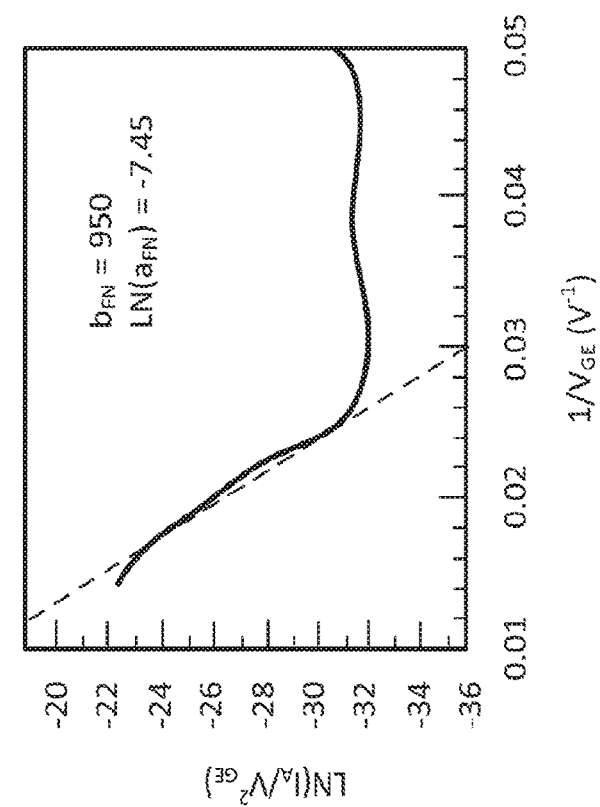
FIGS. 4A-4B depict current through an illustrative electron transparent anode as a function of gate-emitter voltage, according to some embodiments.
Figure 4A:
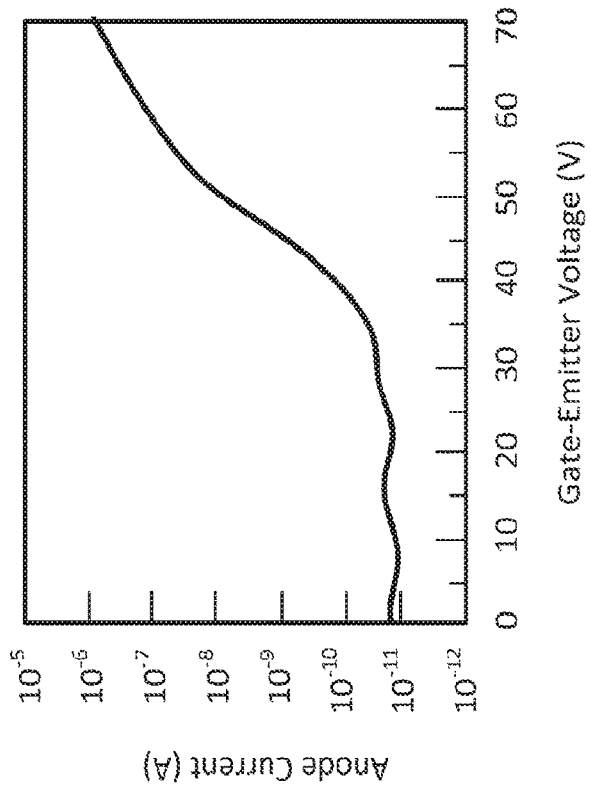

FIGS. 4A-B depict current through an illustrative electron transparent anode as a function of gate-emitter voltage, according to some embodiments. As discussed above, the gate of a field emitter provides an electric field that allows tunneling of electrons out of the field emitter. The greater the gate voltage the more electrons are produced and with higher energy. FIGS. 4A and 4B do not depict actual experimental data but are modeled after real, experimental data for a silicon field emitter comparable to that shown in FIG. 2.

FIG. 4A illustrates current collected in a transparent graphene anode as a function of the gate-emitter voltage. For instance, the data shown in FIG. 4A may correspond to a field emitter array formed from a plurality of instances of device 200 shown in FIG. 2, or the device shown in FIG. 3, where the voltage of the gate 222 is plotted against the current in an anode located exterior to the membrane-encapsulated structure.

As shown in FIG. 4A, below a threshold gate-emitter voltage (around 40V in the illustrative figure), no current distinguishable from noise is detected in the anode. Above this voltage, however, a current that increases with the gate voltage is detected in the anode. This data indicates that, above around a 40 V gate-emitter voltage, the electrons emitted pass through the electron transparent membrane to be measured at the anode.

FIG. 4B illustrates the Fowler-Nordheim (FN) characteristics corresponding to the example of FIG. 4A. The parameters $a_{FN}$ and $b_{FN}$ are the Fowler-Nordheim intercept and slope, respectively.

Figure 5:
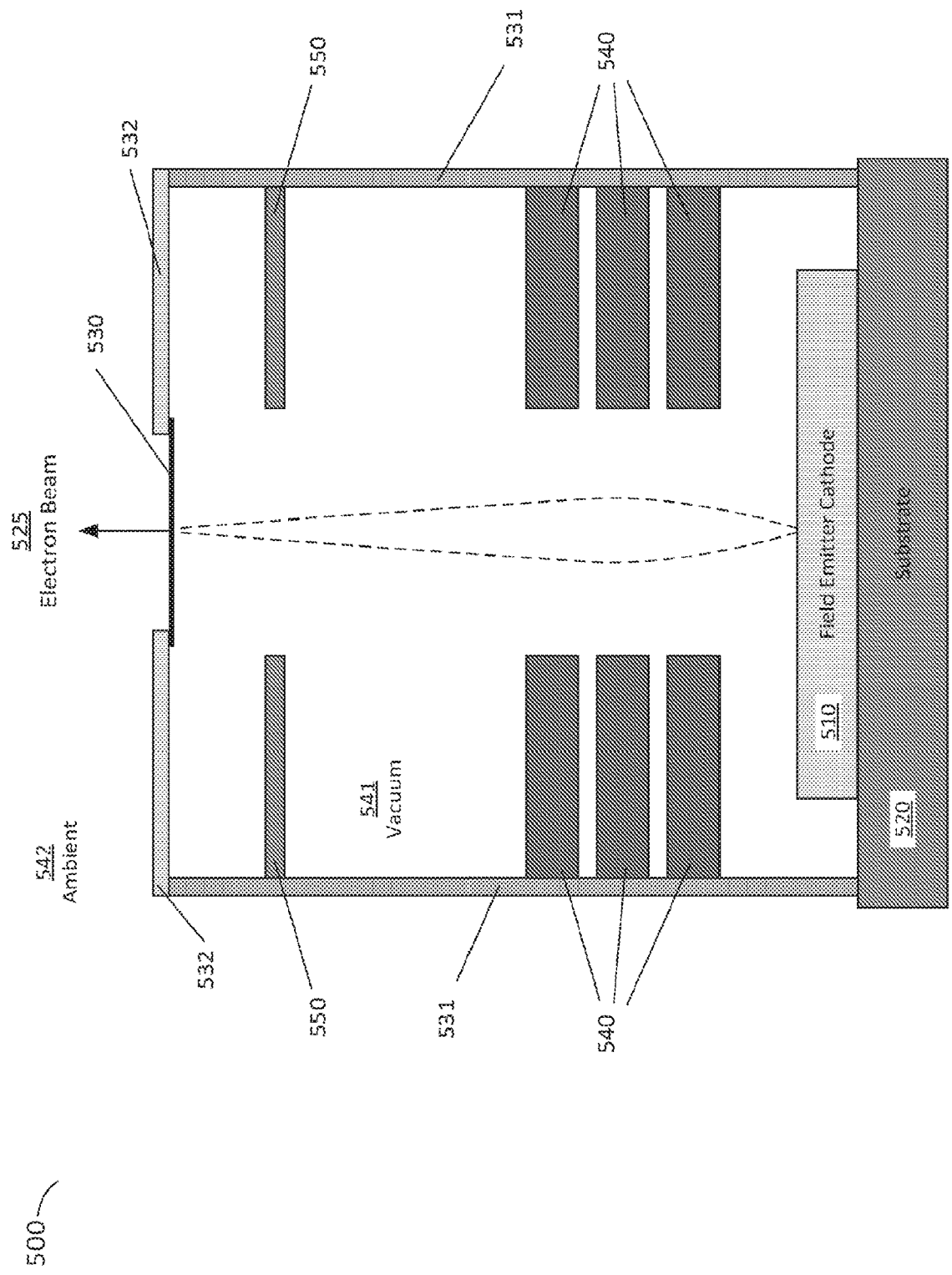
FIG. 5 depicts an illustrative field emitter cathode encapsulated with a plurality of elements configured to shape and increase the energy of a resultant electron beam, according to some embodiments.

FIG. 5 depicts an illustrative field emitter cathode encapsulated with a plurality of elements configured to shape and increase the energy of a resultant electron beam, according to some embodiments. Device 500 is presented as an illustrative configuration of an encapsulated field emitter cathode in which additional components are provided within the interior of the encapsulated structure to adjust the shape of the electron beam produced by the emitter.

As described above in relation to FIG. 1, electrons output by a field emitter may have sufficient energy to propagate through a thin membrane of the encapsulated structure, yet in the example of FIG. 1 the energy and the propagation direction of electrons produced is determined by the physics of the field emitter cathode 110. In applications in which a low divergence electron beam is desirable, it may be beneficial to include additional components that shape the electron beam. These components can, for example, apply a force to any electrons with trajectories other than directly normal to the surface of the membrane (off-axis trajectories) to reduce the divergence of the electron beam. Moreover, components may also be included that increase the energy of the electron beam by accelerating the electrons in an electric field. While these types of components may generally be located within and/or outside of the encapsulated structure of the field emitter, placing the components inside the structure may be desirable so that the encapsulated structure can be treated as an electron-beam-producing module that does not require additional components to produce the desired beam.

In the example of FIG. 5, an Einzel lens 540 and an accelerator 550 are provided within the encapsulated structure. Elements 510, 520, 530, 531, 532, 541 and 542 should be considered to be described at least by the above descriptions of elements 110, 120, 130, 131, 132, 141 and 142, respectively.

Einzel lens 540 may be configured to focus the beam of electrons emitted by the field emitter cathode 510 without changing the energy of the beam. The three annular electrodes shown in FIG. 5 may have an electric potential of 0, +V and 0 volts, respectively, where V is a suitable potential that produces a desired adjustment of the paths of electrons with off-axis trajectories. For example, V may be between −150 V and +150V.

Accelerator 550 may be an electrode held at a suitable potential as to create an electric field that accelerates the electrons of the electron beam produced by the field emitter cathode. For example, accelerator 550 may be an electrode at 100V, 1 kV, 10 kV or 100 kV.

The combination of Einzel lens 540 and accelerator 550 may produce an electron beam with high current density and low divergence, suitable for a wide range of applications. For example, device 500 may be utilized as an electron beam source in an e-beam pumped laser (e.g., a deep-UV semiconductor laser or an excimer laser), an electron microscope, in an e-beam lithography device, e-beam pumped ionizer, etc.

Figure 6:
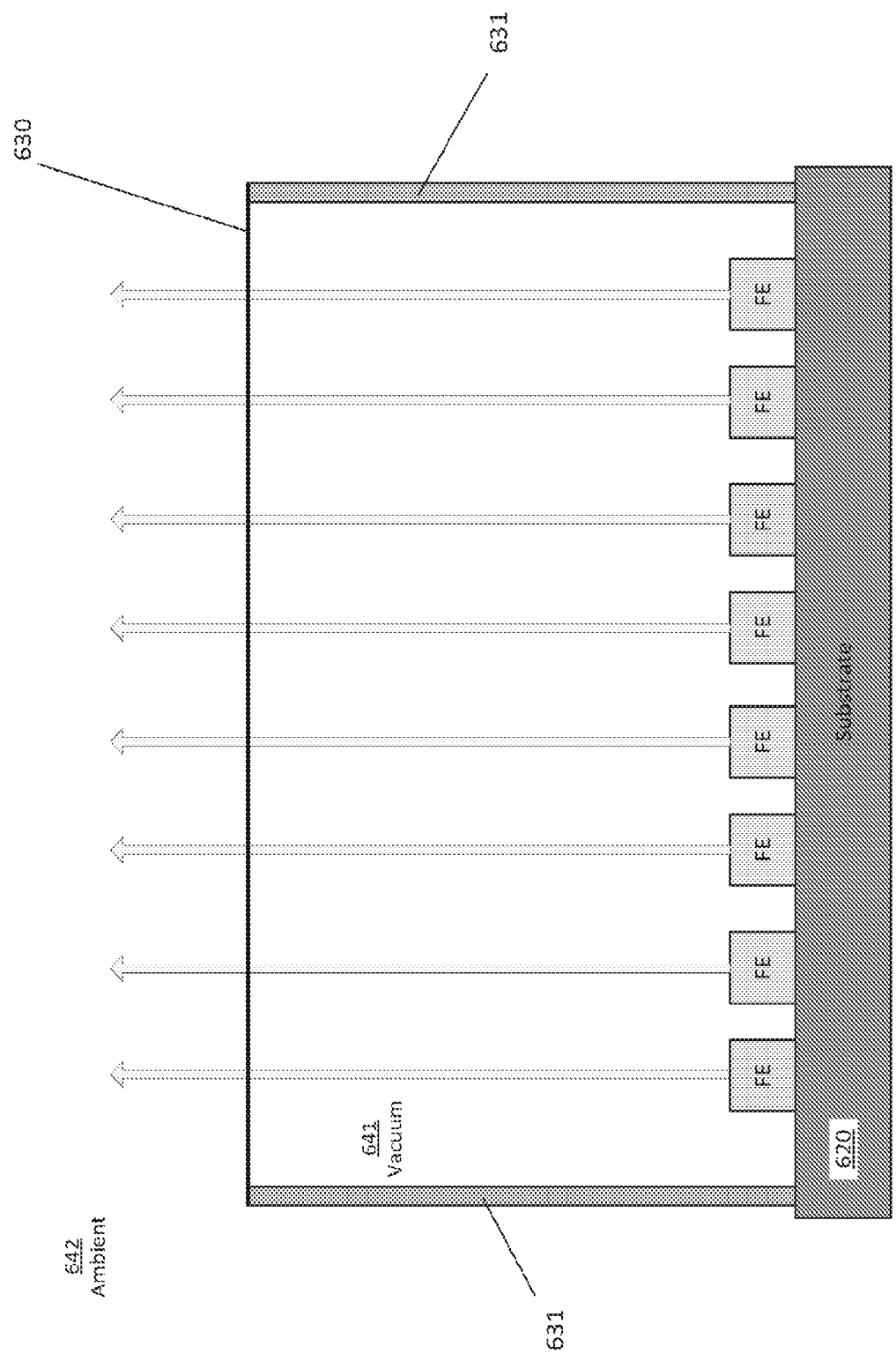
FIG. 6 depicts a field emitter array encapsulated within a single structure having an electron transparent membrane, according to some embodiments.

FIG. 6 depicts a field emitter array encapsulated within a single structure having an electron transparent membrane, according to some embodiments. In the example of FIG. 6, a plurality of field emitters (labeled "FE") are provided within a single encapsulated device 600. The field emitters are encapsulated by standoffs 631 and a thin membrane 630, and each produce electrons that propagate through the membrane, as discussed above. In some embodiments, each of the field emitters in FIG. 6 may be the field emitter depicted in FIG. 2. An array of field emitters may be produced in a regular pattern, such as a two-dimensional rectangular lattice.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A cold cathode device, the device comprising:
   a substrate;
   a field electron emitter disposed upon the substrate and configured to emit electrons in a first direction;
   a structure encapsulating the field electron emitter, thereby creating an airtight seal around the field electron emitter with the field electron emitter arranged in an interior of the structure, at least a portion of the structure being an atomically thin membrane positioned in the first direction with respect to the field electron emitter; and
   at least one electrostatic or magnetic lens located within the structure and configured to direct electrons emitted by the field electron emitter,
   wherein ambient pressure inside the structure is less than 1 Torr,
   wherein the structure fully encapsulates the field electron emitter such that the structure blocks gas from entering or exiting the interior of the structure and maintains the ambient pressure inside the structure at less than 1 Torr, and
   wherein the cold cathode device is configured to operate the field electron emitter as a cathode and the atomically thin membrane as an anode.

2. The cold cathode device of claim 1, further comprising at least one positively charged electrode located within the structure.

3. The cold cathode device of claim 1, wherein the at least one electrostatic or magnetic lens comprises at least one einzel lens.

4. The cold cathode device of claim 3, wherein the einzel lens has an annular shape.

5. The cold cathode device of claim 1, wherein the structure encapsulates a plurality of field electron emitters.

6. The cold cathode device of claim 1, wherein the field electron emitter is a silicon field emitter.

7. The cold cathode device of claim 1, wherein the atomically thin membrane comprises graphene.

8. The cold cathode device of claim 1, wherein the field electron emitter is a semiconductor or metal field emitter.

9. The cold cathode device of claim 5, wherein the plurality of field electron emitters comprises an array of self-aligned gate field emitters.

10. The cold cathode device of claim 6, wherein the silicon field emitter comprises a silicon current limiter.

11. The cold cathode device of claim 1, wherein the field electron emitter comprises a tapered tip.

12. The cold cathode device of claim 11, wherein the tip of the field electron emitter has a coating comprising a semiconductor or metallic material.

13. The cold cathode device of claim 11, wherein the tip of the field electron emitter has a coating comprising at least one noble metal.

14. The cold cathode device of claim 1, wherein the atomically thin membrane comprises a 2-dimensional material.

15. The cold cathode device of claim 14, wherein the atomically thin membrane comprises a single layer of graphene.

16. The cold cathode device of claim 1, wherein the atomically thin membrane comprises silicon nitride and/or amorphous silicon.

17. The cold cathode device of claim 1, further comprising at least one getter located within the structure.

18. An electron microscope comprising the cold cathode of claim 1.

19. An electron-beam pumped or excimer laser comprising the cold cathode of claim 1.

* * * * *

UNITED STATES PATENT AND TRADEMARK OFFICE
CERTIFICATE OF CORRECTION

PATENT NO. : 10,832,885 B2  
APPLICATION NO. : 16/063891  
DATED : November 10, 2020  
INVENTOR(S) : Akinwande et al.

Page 1 of 1

It is certified that error appears in the above-identified patent and that said Letters Patent is hereby corrected as shown below:

In the Specification

Please replace the paragraph at Column 1, Lines 19-22, beneath the heading "GOVERNMENT LICENSE RIGHTS," with the following paragraph:
This invention was made with Government support under Grant Nos. N66001-12-1-4022 and N66001-12-1-4212 awarded by the Space and Naval Warfare Systems Center. The Government has certain rights in the invention.

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*